US010453545B2

(12) United States Patent
Ootera et al.

(10) Patent No.: US 10,453,545 B2
(45) Date of Patent: Oct. 22, 2019

(54) MAGNETIC MEMORY DEVICE AND METHOD FOR MANUFACTURING THE SAME

(71) Applicant: Toshiba Memory Corporation, Tokyo (JP)

(72) Inventors: Yasuaki Ootera, Yokohama Kanagawa (JP); Tsuyoshi Kondo, Kawasaki Kanagawa (JP); Nobuyuki Umetsu, Kawasaki Kanagawa (JP); Michael Arnaud Quinsat, Yokohama Kanagawa (JP); Takuya Shimada, Kawasaki Kanagawa (JP); Masaki Kado, Yokohama Kanagawa (JP); Susumu Hashimoto, Nerima Tokyo (JP); Shiho Nakamura, Fujisawa Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/915,650

(22) Filed: Mar. 8, 2018

(65) Prior Publication Data
US 2018/0358104 A1    Dec. 13, 2018

(30) Foreign Application Priority Data

Jun. 13, 2017   (JP) .................................. 2017-115884

(51) Int. Cl.
*G11C 19/08*     (2006.01)
*H01L 43/02*     (2006.01)
(Continued)

(52) U.S. Cl.
CPC .......... *G11C 19/0841* (2013.01); *G11C 11/14* (2013.01); *H01L 27/222* (2013.01);
(Continued)

(58) Field of Classification Search
CPC ... G11C 11/14; G11C 11/161; G11C 19/0841; H01L 27/222; H01L 43/02; H01L 43/10; H01L 43/12
See application file for complete search history.

(56) References Cited

U.S. PATENT DOCUMENTS 6,955,926 B2    10/2005  Chen
7,551,469 B1 *   6/2009  Parkin ..................... G11C 11/14
                                                    365/158
(Continued)

FOREIGN PATENT DOCUMENTS

JP    2007-109821 A    4/2007
JP    2007-116088 A    5/2007
(Continued)

*Primary Examiner* — Matthew C Landau
*Assistant Examiner* — Mark Hatzilambrou
(74) *Attorney, Agent, or Firm* — Finnegan, Henderson, Farabow, Garrett & Dunner, L.L.P.

(57) ABSTRACT

According to one embodiment, a magnetic memory device includes a first magnetic portion extending in a first direction, a first magnetic layer, and a first nonmagnetic layer provided between the first magnetic layer and a portion of the first magnetic portion. The first magnetic portion has a first surface. The first surface includes bottom portions, and top portions. The bottom portions and the top portions are arranged alternately in the first direction. The bottom portions include a first bottom portion, a second bottom portion adjacent to the first bottom portion in the first direction, a third bottom portion, and a fourth bottom portion adjacent to the third bottom portion in the first direction. The top portions include a first top portion provided between the first bottom portion and the second bottom portion, and a second top portion provided between the third bottom portion and the fourth bottom portion.

11 Claims, 11 Drawing Sheets

(51) Int. Cl.
*H01L 27/22* (2006.01)
*G11C 11/14* (2006.01)
*H01L 43/10* (2006.01)
*G11C 11/16* (2006.01)
*H01L 43/12* (2006.01)

(52) U.S. Cl.
CPC .............. *H01L 43/02* (2013.01); *H01L 43/12* (2013.01); *G11C 11/161* (2013.01); *H01L 43/10* (2013.01)

(56) References Cited

U.S. PATENT DOCUMENTS

| | | |
|---|---|---|
| 2007/0071979 A1 | 3/2007 | Komuro et al. |
| 2013/0235653 A1* | 9/2013 | Kondo .................. G11C 11/161 365/158 |
| 2015/0380638 A1 | 12/2015 | Ootera et al. |

FOREIGN PATENT DOCUMENTS

| | | |
|---|---|---|
| JP | 5583693 B2 | 9/2014 |
| JP | 2016-9806 A | 1/2016 |

\* cited by examiner

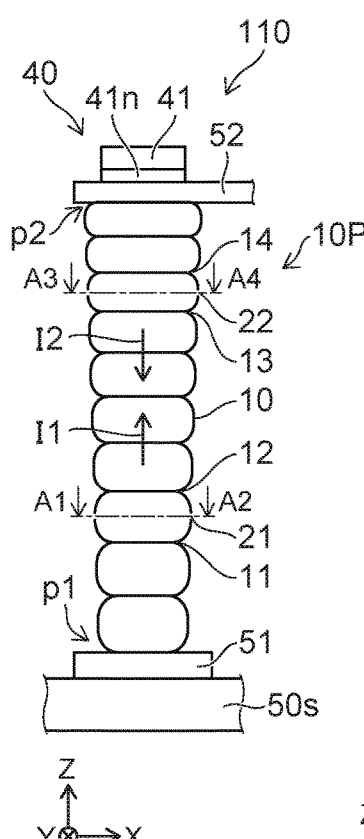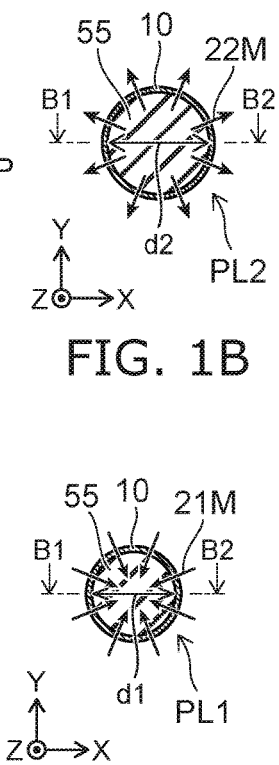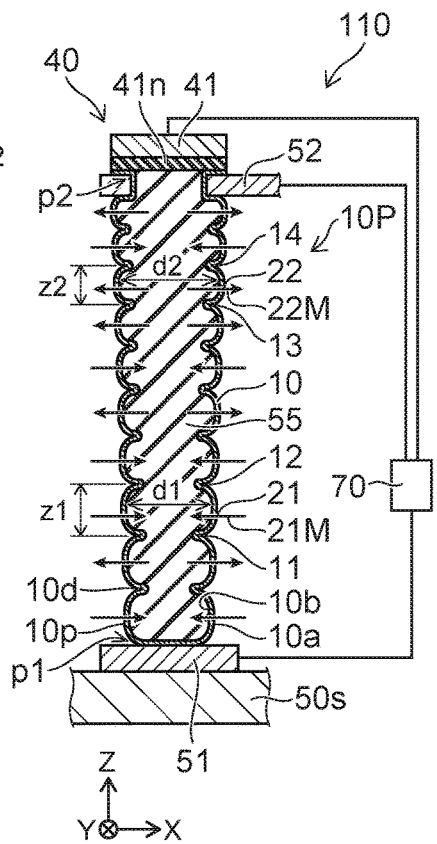
FIG. 1A  FIG. 1B  FIG. 1C  FIG. 1D

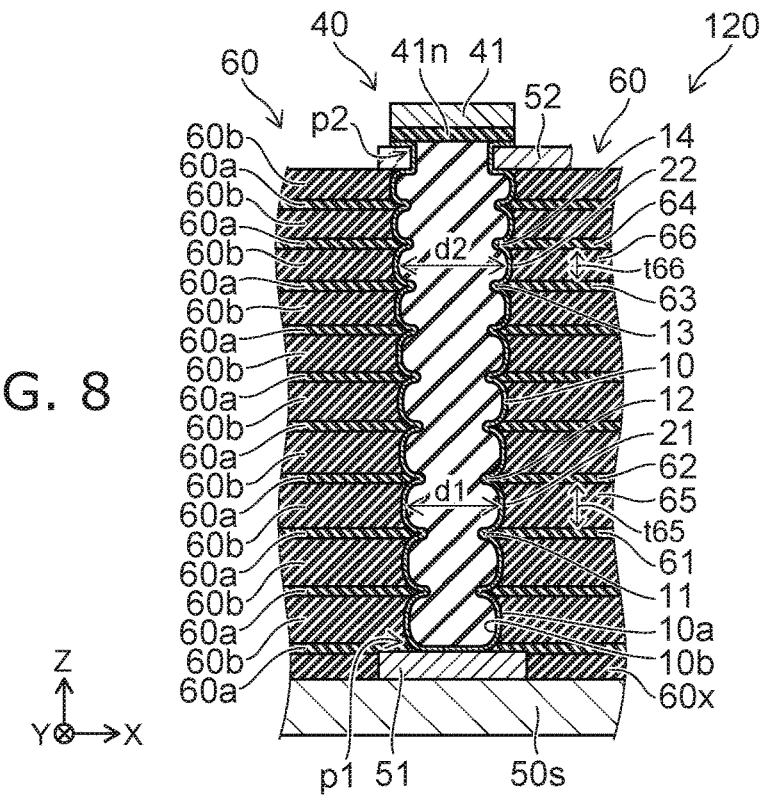
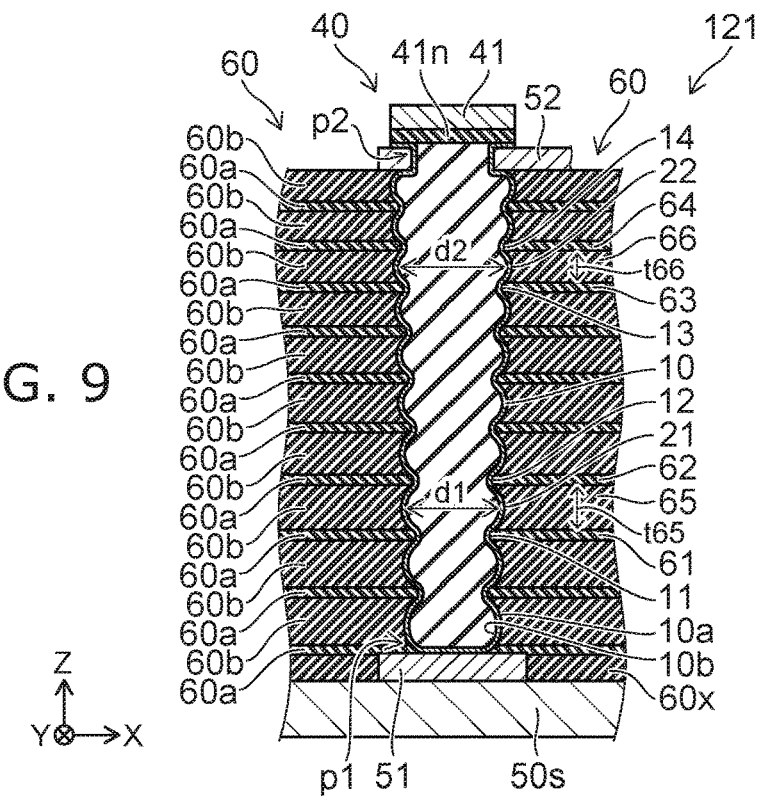

MAGNETIC MEMORY DEVICE AND METHOD FOR MANUFACTURING THE SAME

CROSS-REFERENCE TO RELATED APPLICATIONS

This application is based upon and claims the benefit of priority from Japanese Patent Application No. 2017-115884, filed on Jun. 13, 2017; the entire contents of which are incorporated herein by reference.

FIELD

Embodiments described herein relate generally to a magnetic memory device and a method for manufacturing the same.

BACKGROUND

There is a magnetic memory device in which magnetic domains of a track including a magnetic material are shifted by causing a current to flow in the track. Stable operations of the magnetic memory device are desirable.

BRIEF DESCRIPTION OF THE DRAWINGS

FIG. 1A to FIG. 1D are schematic views illustrating a magnetic memory device according to a first embodiment;

FIG. 8 is a schematic cross-sectional view illustrating another magnetic memory device according to the first embodiment;

FIG. 9 is a schematic cross-sectional view illustrating another magnetic memory device according to the first embodiment;

DETAILED DESCRIPTION

Figure 2:
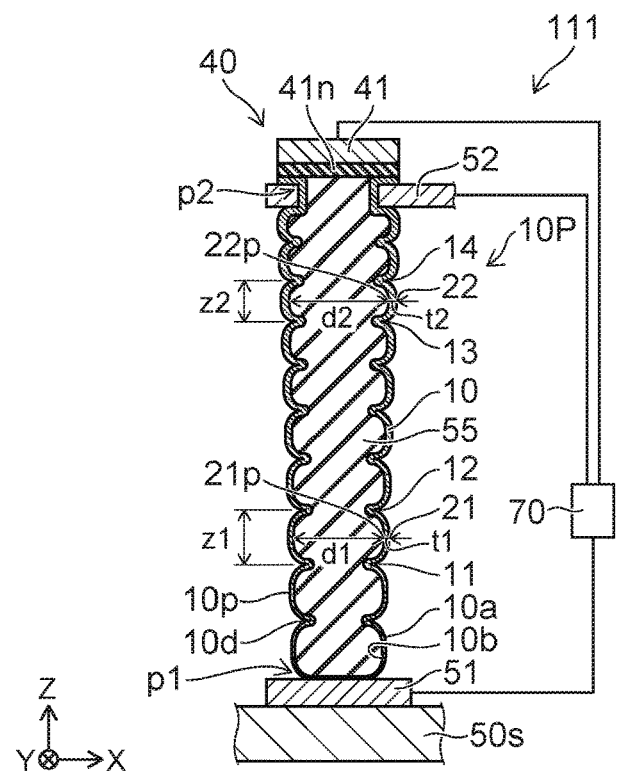
FIG. 2 is a schematic cross-sectional view illustrating another magnetic memory device according to the first embodiment.

According to one embodiment, a magnetic memory device includes a first magnetic portion extending in a first direction, a first magnetic layer, and a first nonmagnetic layer provided between the first magnetic layer and a portion of the first magnetic portion. The first magnetic portion has a first surface. The first surface includes a plurality of bottom portions, and a plurality of top portions. The bottom portions and the top portions are arranged alternately in the first direction. The bottom portions include a first bottom portion, a second bottom portion adjacent to the first bottom portion in the first direction, a third bottom portion, and a fourth bottom portion adjacent to the third bottom portion in the first direction. The top portions include a first top portion provided between the first bottom portion and the second bottom portion, and a second top portion provided between the third bottom portion and the fourth bottom portion. A first distance along the first direction between the first bottom portion and the second bottom portion is different from a second distance along the first direction between the third bottom portion and the fourth bottom portion.

According to another embodiment, a method for manufacturing a magnetic memory device is disclosed. The method can include forming a hole in a first insulating portion by performing a first processing and by performing a second processing after the first processing. The hole extends in a first direction. The method can include forming a first magnetic portion by forming a magnetic film on a side wall of the hole. The first processing includes removing a first removed portion of the first insulating portion by a first etching, forming a first protective film after the first etching, and removing a second removed portion of the first insulating portion by a second etching, the second removed portion being exposed by removing a portion of the first protective film. The second processing includes removing a third removed portion of the first insulating portion after the first processing by a third etching, forming a second protective film after the third etching, and removing a fourth removed portion of the first insulating portion by a fourth etching, the fourth removed portion being exposed by removing a portion of the second protective film. Thicknesses along the first direction of the third removed portion and the fourth removed portion are thicker than thicknesses along the first direction of the first removed portion and the second removed portion.

According to another embodiment, a method for manufacturing a magnetic memory device is disclosed. The method can include forming a first insulating portion on a surface of a base body. The first insulating portion includes a plurality of first films and a plurality of second films. The first films and the second films are arranged alternately in a first direction crossing the surface. A material of the first films is different from a material of the second films. The first films include a first layer and a second layer. The first layer is provided between the second layer and the surface. A thickness in the first direction of the first layer is thicker than a thickness in the first direction of the second layer. The method can include forming a hole in the first insulating portion. The hole extends in the first direction. The method can include forming a first magnetic portion by forming a magnetic film on a side wall of the hole.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

FIG. 1A to FIG. 1D are schematic views illustrating a magnetic memory device according to a first embodiment. FIG. 1A is a side view. FIG. 1B is a line A3-A4 cross-sectional view of FIG. 1A. FIG. 1C is a line A1-A2 cross-sectional view of FIG. 1A. FIG. 1D is a line B1-B2 cross-sectional view of FIG. 1B and FIG. 1C.

As shown in FIG. 1A, the magnetic memory device 110 according to the embodiment includes a first magnetic portion 10, a first magnetic layer 41, and a first nonmagnetic layer 41n.

The first nonmagnetic layer 41n is provided between the first magnetic layer 41 and a portion of the first magnetic portion 10. For example, the first magnetic layer 41 and the first nonmagnetic layer 41n are included in a write/read portion 40. The write/read portion 40 includes, for example, at least a portion of a MTJ element.

The first magnetic portion 10 extends in a first direction. The first direction is taken as a Z-axis direction. One direction perpendicular to the Z-axis direction is taken as an X-axis direction. A direction perpendicular to the Z-axis direction and the X-axis direction is taken as a Y-axis direction.

A first conductive layer 51 and a second conductive layer 52 are provided in the example. The second conductive layer 52 is separated from the first conductive layer 51 in the Z-axis direction. The first magnetic portion 10 includes a first portion p1 and a second portion p2. The direction from the first portion p1 toward the second portion p2 is aligned with the first direction (the Z-axis direction). The first conductive layer 51 is electrically connected to the first portion p1 of the first magnetic portion 10. The second conductive layer 52 is electrically connected to the second portion p2 of the first magnetic portion 10.

A base body 50s is provided in the example. For example, the base body 50s is aligned with the X-Y plane. For example, the first conductive layer 51 is provided on the base body 50s; and the first magnetic portion 10 is provided on the first conductive layer 51.

As described below, a controller 70 (referring to FIG. 1D) is provided in the magnetic memory device 110. For example, the controller 70 is electrically connected to the first conductive layer 51 and the second conductive layer 52. For example, the controller 70 supplies a first current I1 to the first magnetic portion 10 from the first portion p1 toward the second portion p2. Magnetization information (e.g., the states of magnetizations) included in the first magnetic portion 10 moves along the first direction (the Z-axis direction) according to the first current I1. The controller 70 may supply a second current I2 to the first magnetic portion 10 from the second portion p2 toward the first portion p1. The magnetization information (e.g., the states of the magnetizations) included in the first magnetic portion 10 may move along the first direction (the Z-axis direction) according to the second current I2. For example, domain walls move through the first magnetic portion 10 due to the currents. These currents are supplied to the first magnetic portion 10 via the first conductive layer 51 and the second conductive layer 52.

In the magnetic memory device 110, the first magnetic portion 10 is used as a memory portion. The magnetic memory device 110 is, for example, a track-type memory device.

As shown in FIG. 1D, the first magnetic portion 10 has a pipe configuration extending in the first direction (the Z-axis direction) in the example. A core insulating portion 55 is provided on the inner side of the first magnetic portion 10 having the pipe configuration. The first magnetic portion 10 is provided around the core insulating portion 55 extending along the first direction.

In the example, multiple "pinched-in portions" are provided in the first magnetic portion 10.

For example, the first magnetic portion 10 has a first surface 10a. The first surface 10a is a side surface of the first magnetic portion 10. The first surface 10a is, for example, a side surface on the outer side. The first magnetic portion 10 may further have a second surface 10b. The second surface 10b is a side surface of the first magnetic portion 10. The second surface 10b is, for example, a side surface on the inner side. The first surface 10a and the second surface 10b cross a direction perpendicular to the first direction (the Z-axis direction).

The first surface 10a includes multiple unevennesses arranged in the first direction. The multiple unevennesses are portions (unevennesses) of the first surface 10a having different heights along a second direction crossing the first direction. Because the first magnetic portion 10 has the pipe configuration in the example, the unevennesses are unevennesses along any direction aligned with the X-Y plane.

For example, the first surface 10a includes multiple bottom portions 10d and multiple top portions 10p. Each of the multiple bottom portions 10d corresponds to a bottom portion of the first surface 10a in the second direction crossing the first direction (the Z-axis direction). Each of the multiple top portions 10p corresponds to a top portion of the first surface 10a in the second direction.

In one cross section (e.g., FIG. 1D), the second direction recited above corresponds to the X-axis direction. For example, the first magnetic portion 10 has an axis extending in the first direction. For example, the axis passes through the center of the first magnetic portion 10. The unevennesses of the first surface 10a correspond to repeated increases and decreases of the distance along the X-axis direction between the axis recited above and multiple positions of the first surface 10a.

The distance between the first surface 10a and the axis recited above is a minimum at the multiple bottom portions 10d. The distance between the first surface 10a and the axis recited above is a maximum at the multiple top portions 10p.

The multiple bottom portions 10d and the multiple top portions 10p are arranged alternately in the first direction (the Z-axis direction).

For example, the multiple bottom portions 10d include first to fourth bottom portions 11 to 14. The second bottom portion 12 is adjacent to the first bottom portion 11 in the first direction (the Z-axis direction). The distance along the Z-axis direction between the second bottom portion 12 and the first bottom portion 11 is shorter than the distance along the Z-axis direction between the first bottom portion 11 and the other bottom portions 10d.

In the example, the second bottom portion 12 is positioned between the first bottom portion 11 and the third bottom portion 13. The first bottom portion 11 may be positioned between the second bottom portion 12 and the third bottom portion 13.

The fourth bottom portion 14 is adjacent to the third bottom portion 13 in the first direction (the Z-axis direction). The distance along the Z-axis direction between the fourth bottom portion 14 and the third bottom portion 13 is shorter than the distance along the Z-axis direction between the third bottom portion 13 and the other bottom portions 10d.

In the example, the third bottom portion 13 is positioned between the fourth bottom portion 14 and the second bottom portion 12. The fourth bottom portion 14 may be positioned between the third bottom portion 13 and the second bottom portion 12.

The multiple top portions 10p include a first top portion 21 and a second top portion 22. The first top portion 21 is positioned between the first bottom portion 11 and the second bottom portion 12 in the first direction. The second top portion 22 is positioned between the third bottom portion 13 and the fourth bottom portion 14 in the first direction.

In the embodiment, the first magnetic portion 10 includes a structure portion 10P. The structure portion 10P includes the first to fourth bottom portions 11 to 14, the first top portion 21, the second top portion 22, etc., recited above. As described below, the first magnetic portion 10 may include multiple structure portions 10P.

Thus, multiple unevennesses are provided repeatedly in the first surface 10a. For example, the multiple bottom portions 10d correspond to, for example, "pinched-in portions." For example, the multiple top portions 10p correspond to "enlarged portions."

As described above, the magnetization information of the first magnetic portion 10 shifts through the first magnetic portion 10 according to the current flowing in the first magnetic portion 10. For example, the domain walk shift through the first magnetic portion 10. By providing the multiple bottom portions 10d and the multiple top portions 10p recited above, the controllability of the shift of the magnetization information (the shift of the domain walls) improves. For example, the precision of the shift position of the magnetization information is increased by the multiple bottom portions 10d and the multiple top portions 10p recited above.

In the embodiment, the distance between two mutually-adjacent multiple bottom portions 10d is not constant.

For example, as shown in FIG. 1D, the distance along the first direction (the Z-axis direction) between the first bottom portion 11 and the second bottom portion 12 is taken as a first distance z1. The distance along the first direction between the third bottom portion 13 and the fourth bottom portion 14 is taken as a second distance z2. The first distance z1 is different from the second distance z2. Thereby, as described below, the stability of the operations can be improved.

In the example, the first distance z1 is longer than the second distance z2.

FIG. 1C is a cross-sectional view of the first magnetic portion 10 cut by the X-Y plane (a first plane PL1) passing through the first top portion 21. The first plane PL1 is perpendicular to the first direction (the Z-axis direction).

FIG. 1B is a cross-sectional view of the first magnetic portion 10 cut by the X-Y plane (a second plane PL2) passing through the second top portion 22. The second plane PL2 is perpendicular to the first direction (the Z-axis direction).

As shown in FIG. 1B and FIG. 1C, a first cross-sectional area of the first magnetic portion 10 cut by the first plane PL1 is less than a second cross-sectional area of the first magnetic portion 10 cut by the second plane PL2.

In the example, a first diameter d1 of the first magnetic portion 10 cut by the first plane PL1 is smaller than a second diameter d2 of the first magnetic portion 10 cut by the second plane PL2. On the other hand, the thickness of the first magnetic portion 10 (e.g., the multiple top portions 10p) (the thickness of the first magnetic portion 10 in one direction perpendicular to the Z-axis direction) is substantially constant along the Z-axis direction.

For example, the difference of the cross-sectional areas recited above (the difference between the first cross-sectional area and the second cross-sectional area, etc.) occurs due to the difference of the diameters (the difference between the first diameter d1 and the second diameter d2, etc.).

In the embodiment, the first distance z1 recited above is set to be longer than the second distance z2 recited above when the first cross-sectional area is less than the second cross-sectional area. These distances correspond to the movement distance of one bit in the first magnetic portion 10.

Thereby, for example, higher controllability of the shift of the magnetization information according to the current (the shift of the domain walls) is obtained.

For example, the movement speed of the domain walls in the first magnetic portion 10 is dependent on the current density of the current flowing through the first magnetic portion 10. For example, in one first magnetic portion 10, when portions having different current densities exist, the movement speed of the domain walls (the movement speed of the bits) of portions are different from those of the other portions. In such a case, errors occur easily due to the difference of the movement speeds of the bits.

In the embodiment, the first distance z1 is set to be different from the second distance z2. For example, these distances (the movement distances of the bits) are changed to correspond to the difference of the movement speeds of the bits. For example, when the first cross-sectional area is less than the second cross-sectional area, the first distance z1 recited above is set to be longer than the second distance z2 recited above.

Thereby, the errors occurring due to the difference of the bit shift speeds caused by the difference of the current densities can be suppressed. A magnetic memory device can be provided in which the stability of the operations can be improved.

For example, when the first cross-sectional area is less than the second cross-sectional area, the current density at the first top portion 21 is higher than the current density at the second top portion 22. In such a case, the first distance z1 is set to be longer than the second distance z2. The stability of the operations can be improved.

For example, a first product of the first cross-sectional area and the first distance z1 may be substantially the same as a second product of the second cross-sectional area and the second distance z2, For example, the first product is not less than 0.8 times and not more than 1.2 times the second product.

As shown in FIG. 1B to FIG. 1D, the magnetization of at least a portion of the first magnetic portion 10 crosses the first direction (the Z-axis direction). For example, the magnetization of the first magnetic portion 10 is substantially perpendicular to the film surface of the first magnetic portion 10. For example, a first magnetization 21M of the first top portion 21 and a second magnetization 22M of the second top portion 22 are substantially aligned with the X-Y plane. In the example, the first magnetization 21M is from the outer side toward the inner side. In the example, the second magnetization 22M is from the inner side toward the outer side. Such a difference of the directions of the magnetizations corresponds to the difference of the information that is stored.

FIG. 2 is a schematic cross-sectional view illustrating another magnetic memory device according to the first embodiment.

FIG. 2 is a cross-sectional view corresponding to FIG. 1D.

As shown in FIG. 2, the first magnetic portion 10 and the write/read portion 40 (the first magnetic layer 41 and the first nonmagnetic layer 41n) are provided in the magnetic memory device 111 as well. In the magnetic memory device 111, the thickness of the first magnetic portion 10 changes in the Z-axis direction. Otherwise, the configuration of the magnetic memory device 111 is similar to, for example, the magnetic memory device 110. The first magnetic portion 10 of the magnetic memory device 111 will now be described.

In the example as well, the first magnetic portion 10 has a pipe configuration extending along the first direction (the Z-axis direction).

The first magnetic portion 10 has the first surface 10a and the second surface 10b. As described above, the first surface 10a includes the multiple bottom portions 10d and the multiple top portions 10p. Even in such a case, the multiple bottom portions 10d and the multiple top portions 10p are arranged alternately in the first direction. The multiple bottom portions 10d include the first to fourth bottom portions 11 to 14 recited above. The multiple top portions 10p include the first top portion 21 and the second top portion 22.

The direction from the second surface 10b toward the first surface 10a is aligned with the second direction recited above (the direction crossing the first direction (the Z-axis direction)). In the cross section shown in FIG. 2, the second direction corresponds to the X-axis direction.

The second surface 10b has a first back surface position 21p and a second back surface position 22p. The direction from the first back surface position 21p toward the first top portion 21 is parallel to the second direction. The direction from the second back surface position 22p toward the second top portion 22 is parallel to the second direction.

The length along the second direction (e.g., the X-axis direction) between the first back surface position 21p and the first top portion 21 is taken as a first length t1. The length along the second direction (e.g., the X-axis direction) between the second back surface position 22p and the second top portion 22 is taken as a second length t2. These lengths correspond to the film thickness of the first magnetic portion 10.

In the magnetic memory device 111, the first length t1 is shorter than the second length t2. In other words, the thickness at the first top portion 21 is thinner than the thickness at the second top portion 22. In such a case, the first distance z1 is longer than the second distance z2.

For example, in the magnetic memory device 111, the thickness of the first magnetic portion 10 is different by location. The current density is high at the portions where the thickness is thin. In such a case, the first distance z1 is set to be longer than the second distance z2. The errors occurring due to the difference of the bit shift speeds caused by the difference of the current densities can be suppressed. A magnetic memory device can be provided in which the stability of the operations can be improved.

In the example, the first diameter d1 is smaller than the second diameter d2. Therefore, the difference of the cross-sectional areas is large. In such a case, stable operations are obtained by setting the first distance z1 to be different from the second distance z2.

In the magnetic memory device 111, the first length t1 may be different from the second length t2; and the first diameter d1 may be substantially the same as the second diameter d2.

Figure 3:
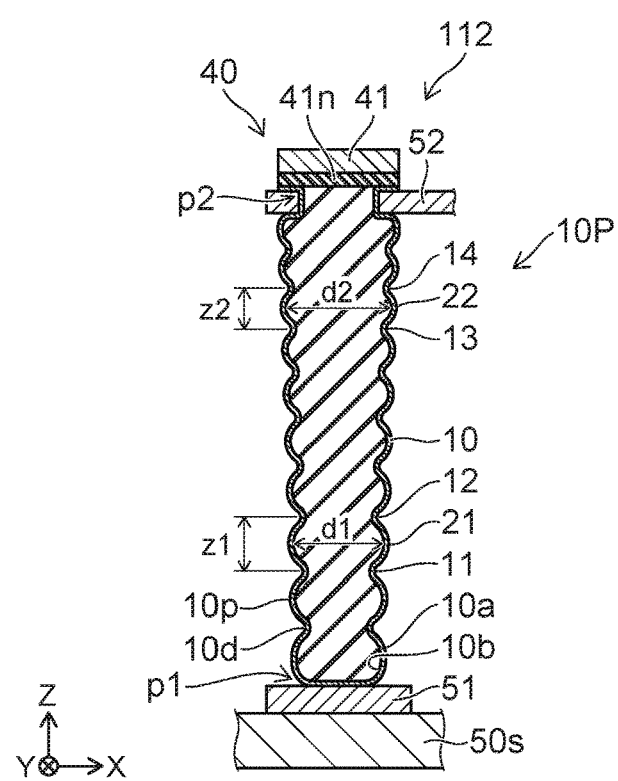
FIG. 3 is a schematic cross-sectional view illustrating other magnetic memory devices according to the first embodiment.
Figure 4:
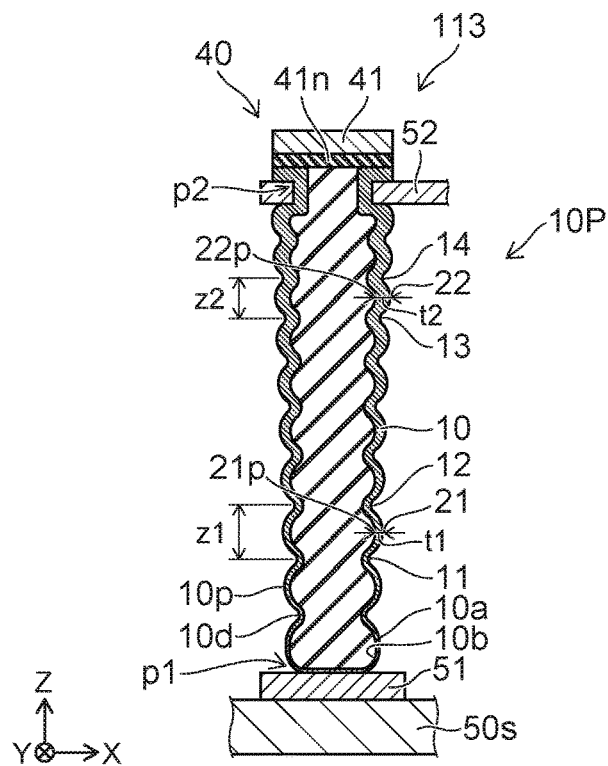
FIG. 4 is a schematic cross-sectional view illustrating other magnetic memory devices according to the first embodiment.
Figure 5:
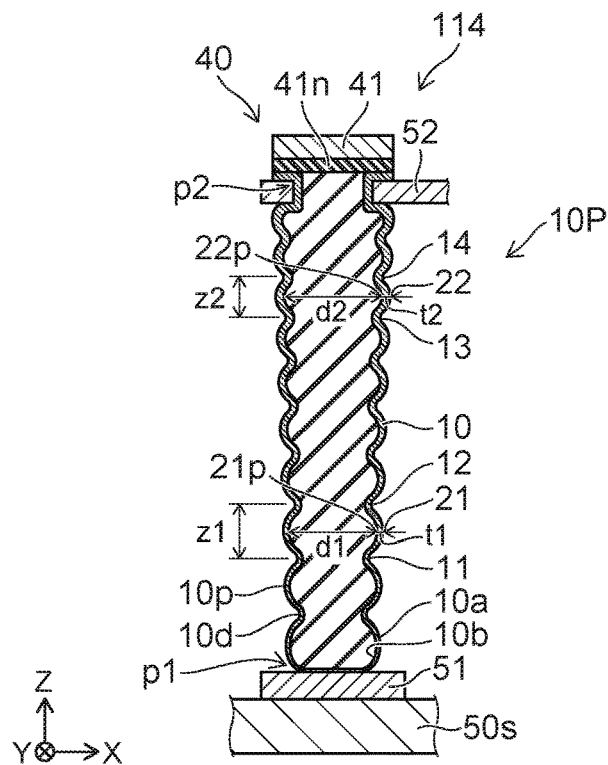
FIG. 5 is a schematic cross-sectional view illustrating other magnetic memory devices according to the first embodiment.

FIG. 3 to FIG. 5 are schematic cross-sectional views illustrating other magnetic memory devices according to the first embodiment. These drawings are cross-sectional views corresponding to FIG. 1D. The controller 70 (referring to FIG. 1D) is not illustrated in these drawings.

As shown in FIG. 3, the first magnetic portion 10 and the write/read portion 40 (the first magnetic layer 41 and the first nonmagnetic layer 41n) are provided in a magnetic memory device 112 as well. In the magnetic memory device 112, the configuration of the unevennesses of the first surface 10a (the multiple bottom portions 10d and the multiple top portions 10p) of the first magnetic portion 10 is different from that of the magnetic memory device 110.

In the magnetic memory device 112, the unevennesses of the first surface 10a of the first magnetic portion 10 repeatedly change in a wave-like configuration. In the magnetic memory device 112 as well, the first diameter d1 is smaller than the second diameter d2. The first distance z1 is longer than the second distance z2. The first cross-sectional area is less than the second cross-sectional area because the first diameter d1 is smaller than the second diameter d2. Thereby, the errors occurring due to the difference of the bit shift speeds caused by the difference of the current densities can be suppressed.

As shown in FIG. 4, the first magnetic portion 10 and the write/read portion 40 (the first magnetic layer 41 and the first nonmagnetic layer 41n) are provided in a magnetic memory device 113 as well. In the magnetic memory device 113 as well, the configuration of the unevennesses of the first surface 10a (the multiple bottom portions 10d and the multiple top portions 10p) of the first magnetic portion 10 repeatedly changes in a wave-like configuration. The first length t1 (the thickness) is shorter than the second length t2 (the thickness). The first distance z1 is longer than the second distance z2. The current densities are different due to the difference of the thicknesses. The errors occurring due to the difference of the bit shift speeds caused by the difference of the current densities can be suppressed.

As shown in FIG. 5, the first magnetic portion 10 and the write/read portion 40 (the first magnetic layer 41 and the first nonmagnetic layer 41n) are provided in a magnetic memory device 114 as well. In the magnetic memory device 114, the first diameter d1 is smaller than the second diameter d2. Further, the first length t1 (the thickness) is shorter than the second length t2 (the thickness). The first distance z1 is longer than the second distance z2. The current densities are different due to the difference of the thicknesses and the difference of the diameters. The errors occurring due to the difference of the bit shift speeds caused by the difference of the current densities can be suppressed.

In the magnetic memory devices 112 to 114 as well, a magnetic memory device can be provided in which the stability of the operations can be improved.

In the magnetic memory devices 111 to 114, the first diameter d1 and the second diameter d2 each are, for example, not less than 15 nm and not more than 100 nm. In such a case, for example, a high storage density is obtained. In such a case, for example, a sufficient current density is obtained. In such a case, for example, a sufficient magnetic stability is obtained. The first distance z1 and the second distance z2 each are, for example, not less than 5 nm and not more than 100 nm. In such a case, for example, a stable memory operation is easier to obtain. In such a case, for example, a high recording density is easier to obtain.

Figure 6A:
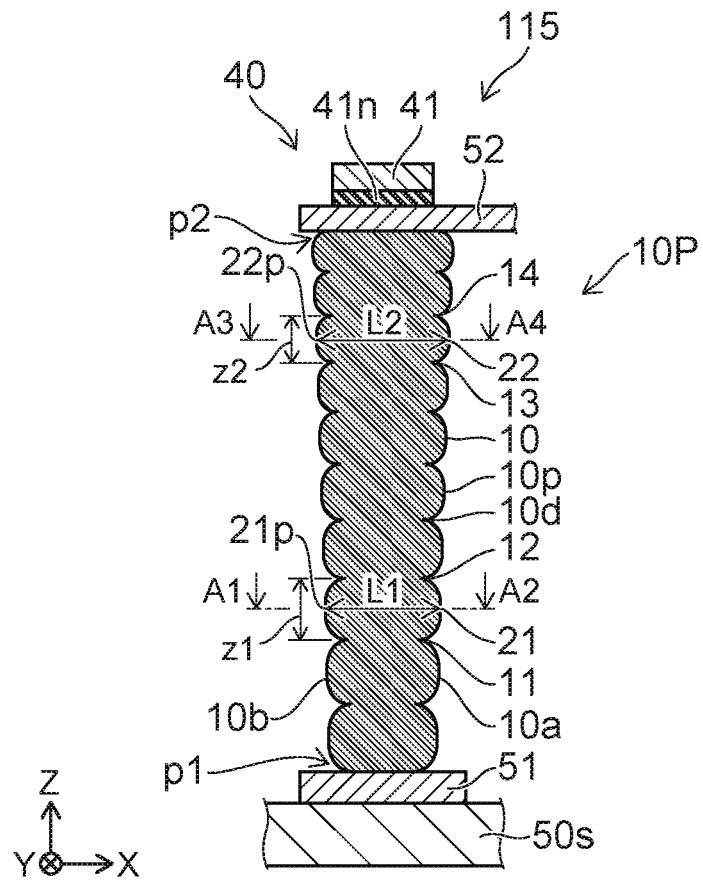
FIG. 6A to FIG. 6C are schematic cross-sectional views illustrating another magnetic memory device according to the first embodiment.
Figure 6B:
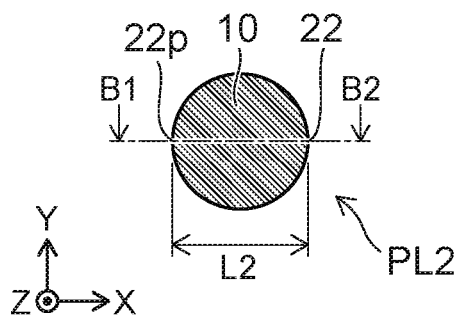
Figure 6C:
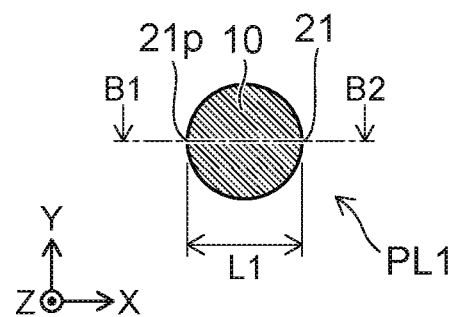

FIG. 6A to FIG. 6C are schematic cross-sectional views illustrating another magnetic memory device according to the first embodiment.

FIG. 6A is a line B1-B2 cross-sectional view of FIG. 6A and FIG. 6B. FIG. 6B is a line A3-A4 cross-sectional view of FIG. 6A. FIG. 6C is a line A1-A2 cross-sectional view of FIG. 6A. The controller 70 (referring to FIG. 1D) is not illustrated in these drawings.

As shown in FIG. 6A, the first magnetic portion 10 and the write/read portion 40 (the first magnetic layer 41 and the first nonmagnetic layer 41n) are provided in the magnetic memory device 115 according to the embodiment as well. In the magnetic memory device 115, the first magnetic portion 10 has a columnar configuration (a substantially circular columnar configuration) extending in the first direction (the Z-axis direction). Otherwise, the configuration of the magnetic memory device 115 is similar to, for example, that of the magnetic memory device 110. An example of the first magnetic portion 10 of the magnetic memory device 115 will now be described.

In the magnetic memory device 115, the first magnetic portion 10 has the first surface 10a and the second surface 10b. As described above, the first surface 10a includes the multiple bottom portions 10d in the second direction crossing the first direction (the Z-axis direction) and the multiple top portions 10p in the second direction. Even in such a case, the multiple bottom portions 10d and the multiple top portions 10p are arranged alternately in the first direction. The multiple bottom portions 10d include the first to fourth bottom portions 11 to 14 recited above. The multiple top portions 10p include the first top portion 21 and the second top portion 22.

The direction from the second surface 10b toward the first surface 10a is aligned with the second direction recited above (the direction crossing the Z-axis direction). In the cross sections shown in FIG. 6A to FIG. 6C, the second direction corresponds to the X-axis direction.

The second surface 10b has the first back surface position 21p and the second back surface position 22p. The direction from the first back surface position 21p toward the first top portion 21 is parallel to the second direction. The direction from the second back surface position 22p toward the second top portion 22 is parallel to the second direction.

The length along the second direction (e.g., the X-axis direction) between the first back surface position 21p and the first top portion 21 is taken as a first length L1. The length along the second direction (e.g., the X-axis direction) between the second back surface position 22p and the second top portion 22 is taken as a second length L2. These lengths correspond to the widths (e.g., the widths in the X-axis direction) of the first magnetic portion 10.

In the magnetic memory device 115, the first length L1 is shorter than the second length L2. In other words, the width of the first top portion 21 is narrower than the width of the second top portion 22. In such a case, the first distance z1 is longer than the second distance z2.

As shown in FIG. 6B and FIG. 6C, the cross-sectional area (the cross-sectional area in the first plane PL1) of the first top portion 21 is less than the cross-sectional area (the cross-sectional area in the second plane PL2) of the second top portion 22. A difference of the current densities occurs due to such a difference of the cross-sectional areas. In such a case, the errors occurring due to the difference of the bit shift speeds caused by the difference of the current densities can be suppressed by setting the first distance z1 to be different from the second distance z2.

Figure 7A:
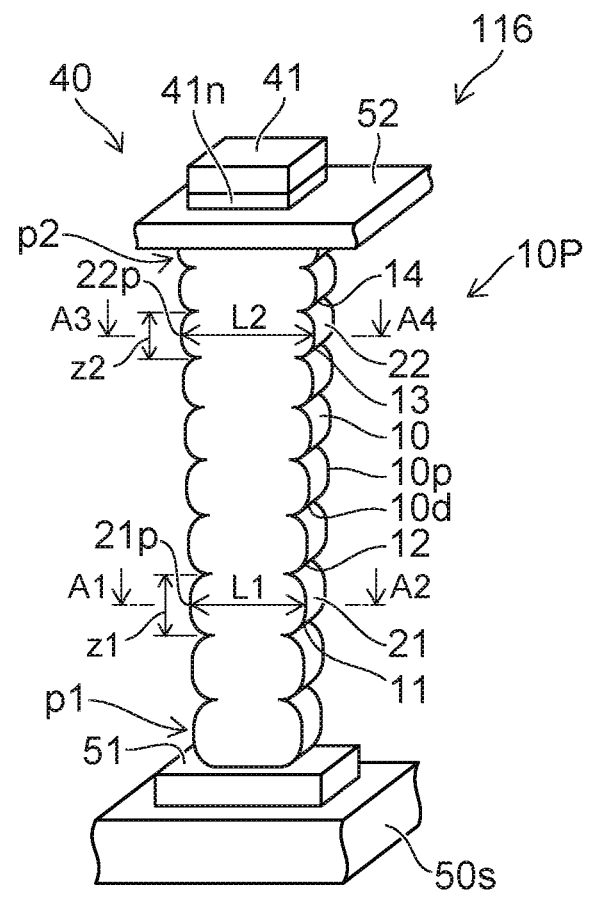
FIG. 7A to FIG. 7C are schematic views illustrating another magnetic memory device according to the first embodiment.
Figure 7B:
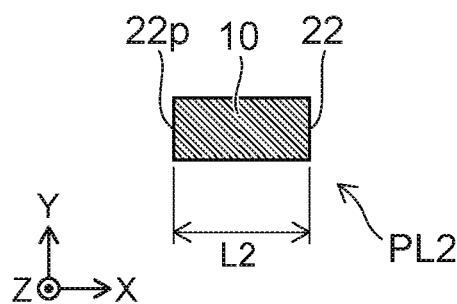
Figure 7C:
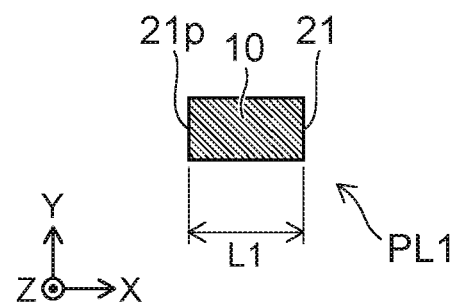

FIG. 7A to FIG. 7C are schematic views illustrating another magnetic memory device according to the first embodiment.

FIG. 7A is a perspective view. FIG. 7B is a line A3-A4 cross-sectional view of FIG. 7A. FIG. 7C is a line A1-A2 cross-sectional view of FIG. 7A. The controller 70 (referring to FIG. 1D) is not illustrated in these drawings.

As shown in FIG. 7C, the first magnetic portion 10 and the write/read portion 40 (the first magnetic layer 41 and the first nonmagnetic layer 41n) are provided in the magnetic memory device 116 according to the embodiment as well. In the magnetic memory device 116, the first magnetic portion 10 has a columnar configuration (a substantially polygonal prism configuration) extending in the first direction (the Z-axis direction). Otherwise, the configuration of the magnetic memory device 116 is similar to, for example, that of the magnetic memory device 115.

In the magnetic memory device 116 as well, the first magnetic portion 10 has the first surface 10a and the second surface 10b. The first length L1 is shorter than the second length L2. The first distance z1 is longer than the second distance z2.

As shown in FIG. 7B and FIG. 7C, the cross-sectional area (the cross-sectional area in the first plane PL1) of the first top portion 21 is less than the cross-sectional area (the cross-sectional area in the second plane PL2) of the second top portion 22. A difference of the current densities occurs due to such a difference of the cross-sectional areas. In such a case, the errors occurring due to the difference of the bit shift speeds caused by the difference of the current densities can be suppressed by setting the first distance z1 to be different from the second distance z2.

In the magnetic memory devices 115 and 116 as well, a magnetic memory device can be provided in which the stability of the operations can be improved.

The base body 50s is provided in the magnetic memory devices 110 to 116 recited above. The first top portion 21 is positioned between the second top portion 22 and the base body 50s in the first direction (the Z-axis direction). In such a case, the first distance z1 is longer than the second distance z2.

As described below, for example, an insulating portion is provided on the base body 50s; and a hole that extends in the Z-axis direction is provided in the insulating portion. The first magnetic portion 10 is formed by forming a magnetic film on the side wall of the hole.

When forming the hole, for example, there are cases where the diameter of the hole at a position proximal to the base body 50s (the bottom portion of the hole) is smaller than the diameter of the hole at a position distal to the base body 50s (the opening of the hole). Therefore, there are cases where the diameter of the magnetic film formed on the side wall of the hole changes in the Z-axis direction. In such a case, the first distance z1 is set to be longer than the second distance z2. Thereby, there are cases where the cross-sectional area of the first magnetic portion 10 changes due to the change of the diameter of the hole. Even in such a case, the errors that occur due to the difference of the shift speeds can be suppressed.

For example, when forming the magnetic film recited above on the side wall of the hole, there are cases where the thickness of the magnetic film at a position proximal to the base body 50s (the bottom portion of the hole) is thinner than the thickness of the magnetic film at a position distal to the base body 50s (the opening of the hole). In such a case, the first distance z1 is set to be longer than the second distance z2. Thereby, there are cases where the cross-sectional area of the first magnetic portion 10 changes due to the change of the thickness of the magnetic film. Even in such a case, the errors occurring due to the difference of the bit shift speeds can be suppressed.

FIG. 8 is a schematic cross-sectional view illustrating another magnetic memory device according to the first embodiment.

The controller 70 (referring to FIG. 1D) is not illustrated in FIG. 8.

As shown in FIG. 8, the first magnetic portion 10 and a first insulating portion 60 are provided in the magnetic memory device 120 according to the embodiment. For example, the write/read portion 40 (the first magnetic layer 41 and the first nonmagnetic layer 41n), the first conductive layer 51, the second conductive layer 52, and the base body 50s are further provided. As described above, the first nonmagnetic layer 41n is provided between the first magnetic layer 41 and a portion of the first magnetic portion 10. The first conductive layer 51 and an insulating film 60X are provided on the base body 50s. The insulating film 60X may be omitted.

For example, the controller 70 supplies, to the first magnetic portion 10, the first current I1 from the first portion p1 toward the second portion p2 (referring to FIG. 1A) or the second current I2 from the second portion p2 toward the first portion p1 (referring to FIG. 1A). The magnetization information (e.g., the states of the magnetizations) included in the first magnetic portion 10 moves along the first direction (the Z-axis direction) according to these currents. For example, the domain walls move.

The second direction from the first magnetic portion 10 toward the first insulating portion 60 crosses the first direction (the Z-axis direction). In the cross-sectional view shown in FIG. 8, the second direction corresponds to the X-axis direction.

The first insulating portion 60 includes multiple first films 60a and multiple second films 60b. The multiple first films 60a and the multiple second films 60b are arranged alternately along the Z-axis direction. The material of the multiple first films 60a is different from the material of the multiple second films 60b.

The first insulating portion 60 includes first to sixth insulating layers 61 to 66. In the example, the first to fourth insulating layers 61 to 64 correspond respectively to the multiple first films 60a. In the example, the fifth insulating layer 65 and the sixth insulating layer 66 correspond respectively to the multiple second films 60b.

The fifth insulating layer 65 is positioned between the first insulating layer 61 and the second insulating layer 62 in the first direction (the Z-axis direction). The fifth insulating layer 65 contacts the first insulating layer 61 and the second insulating layer 62.

The direction from the third insulating layer 63 toward the first insulating layer 61 is aligned with the first direction (the Z-axis direction).

The sixth insulating layer 66 is positioned between the third insulating layer 63 and the fourth insulating layer 64 in the first direction (the Z-axis direction). The sixth insulating layer 66 contacts the third insulating layer 63 and the fourth insulating layer 64.

In the example, the second insulating layer 62 is positioned between the first insulating layer 61 and the third insulating layer 63. The first insulating layer 61 may be positioned between the second insulating layer 62 and the third insulating layer 63. In the example, the third insulating layer 63 is positioned between the second insulating layer 62 and the fourth insulating layer 64. The fourth insulating layer 64 may be positioned between the second insulating layer 62 and the third insulating layer 63.

The material of the fifth insulating layer 65 and the sixth insulating layer 66 is different from the material of the first to fourth insulating layers 61 to 64.

In the magnetic memory device 120, a first thickness t65 along the first direction (the Z-axis direction) of the fifth insulating layer 65 is different from a second thickness t66 along the first direction of the sixth insulating layer 66.

In one method for manufacturing the first magnetic portion 10 as described below, a hole is formed in the first insulating portion 60 recited above. The first insulating portion 60 includes the multiple first films 60a and the multiple second films 60b. Because the material of the multiple first films 60a is different from the material of the multiple second films 60b, the etching rate is different between these two types of films. Therefore, the unevennesses are formed in the side wall of the hole. The first magnetic portion 10 is formed by forming the magnetic film on the surface of the unevennesses. Thereby, for example, the multiple bottom portions 10d and the multiple top portions 10p are formed in the first surface 10a (the side surface on the outer side) of the first magnetic portion 10.

In the example, the multiple first films 60a oppose the multiple bottom portions 10d. The multiple second films 60b oppose the multiple top portions 10p. For example, such a structure is formed when the etching rate of the multiple first films 60a is lower (slower) than the etching rate of the multiple second films 60b.

In the embodiment, the first thickness t65 of the fifth insulating layer 65 and the second thickness t66 of the sixth insulating layer 66 are different from each other. Thereby, for example, the distances along the Z-axis direction between the multiple bottom portions 10d are different from each other. For example, the first magnetic portion 10 has the first surface 10a. The first surface 10a opposes the first insulating portion 60. The first surface 10a includes the first to fourth bottom portions 11 to 14, the first top portion 21, and the second top portion 22. The direction from the first bottom portion 11 toward the first insulating layer 61 is aligned with the second direction (e.g., the X-axis direction). The direction from the second bottom portion 12 toward the second insulating layer 62 is aligned with the second direction (e.g., the X-axis direction). The direction from the third bottom portion 13 toward the third insulating layer 63 is aligned with the second direction (e.g., the X-axis direction). The direction from the fourth bottom portion 14 toward the fourth insulating layer 64 is aligned with the second direction (e.g., the X-axis direction). The direction from the first top portion 21 toward the fifth insulating layer 65 is aligned with the second direction (e.g., the X-axis direction). The direction from the second top portion 22 toward the sixth insulating layer 66 is aligned with the second direction (e.g., the X-axis direction).

In such a case, the first thickness t65 is thicker than the second thickness t66. In such a case, for example, the distance (e.g., the first distance z1 referring to FIG. 1D)

between the first bottom portion 11 and the second bottom portion 12 is longer than the distance (e.g, the second distance z2 referring to FIG. 1D) between the third bottom portion 13 and the fourth bottom portion 14.

In the magnetic memory device 120, for example, the first diameter d1 is smaller than the second diameter d2. There are cases where the first cross-sectional area of the portion of the first magnetic portion 10 corresponding to the fifth insulating layer 65 is less than the second cross-sectional area of the portion corresponding to the sixth insulating layer 66. Thereby, there are cases where the current density is nonuniform. In such a case, the first thickness t65 is set to be thicker than the second thickness t66. Thereby, the errors occurring due to the difference of the bit shift speeds can be suppressed.

FIG. 9 is a schematic cross-sectional view illustrating another magnetic memory device according to the first embodiment.

The controller 70 (referring to FIG. 1D) is not illustrated in FIG. 9.

As shown in FIG. 9, the first agnetic portion 10 and the first insulating portion 60 are provided in the magnetic memory device 121 according to the embodiment as well. The configuration of the first surface 10a of the first magnetic portion 10 of the magnetic memory device 121 is different from that of the magnetic memory device 120. Otherwise, the configuration of the magnetic memory device 121 is similar to that of the magnetic memory device 120.

In the magnetic memory device 121, the unevennesses of the first surface 10a repeatedly change in a wave-like configuration. In the magnetic memory device 121 as well, the first surface 10a includes the first to fourth bottom portions 11 to 14, the first top portion 21, and the second top portion 22. The first thickness t65 is thicker than the second thickness t66. Thereby, the errors occurring due to the difference of the bit shift speeds can be suppressed.

In the magnetic memory devices 120 and 121, the thicknesses of the multiple first films 60a each are thinner than the thicknesses of the multiple second films 60b.

Figure 10:
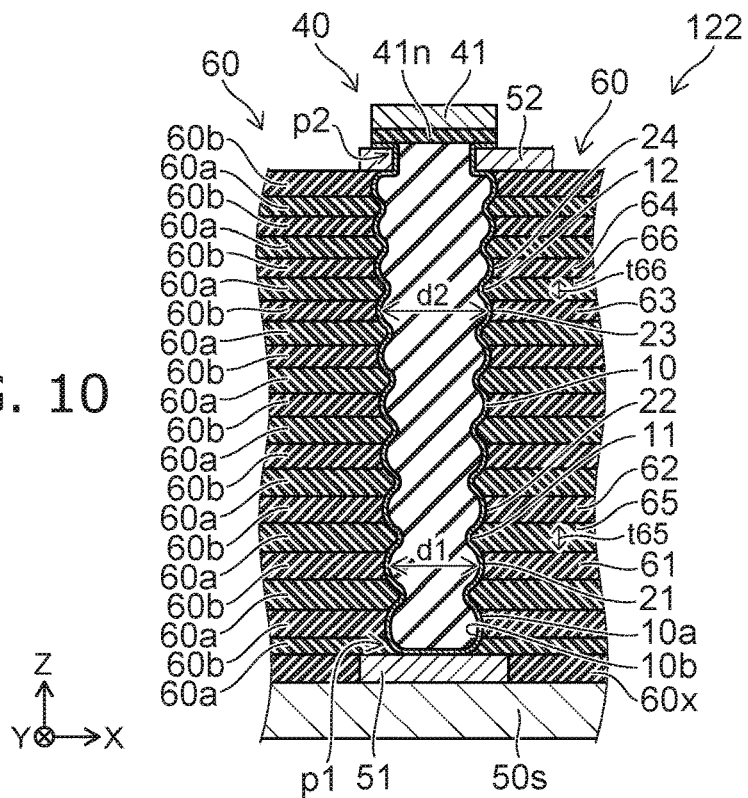
FIG. 10 is a schematic cross-sectional view illustrating another magnetic memory device according to the first embodiment.

FIG. 10 is a schematic cross-sectional view illustrating another magnetic memory device according to the first embodiment.

The controller 70 (referring to FIG. 1D) is not illustrated in FIG. 10.

As shown in FIG. 10, the first magnetic portion 10 and the first insulating portion 60 are provided in the magnetic memory device 122 according to the embodiment as well. The first insulating portion 60 includes the multiple first films 60a and the multiple second films 60b.

The first insulating portion 60 includes the first to sixth insulating layers 61 to 66. In the example, the first to fourth insulating layers 61 to 64 correspond respectively to the multiple second films 60b. In the example, the fifth insulating layer 65 and the sixth insulating layer 66 correspond respectively to the multiple first films 60a.

The first magnetic portion 10 has the first surface 10a opposing the first insulating portion 60. The first surface 10a includes the first to fourth top portions 21 to 24, the first bottom portion 11, and the second bottom portion 12.

The direction from the first top portion 21 toward the first insulating layer 61, the direction from the second top portion 22 toward the second insulating layer 62, the direction from the third top portion 23 toward the third insulating layer 63, and the direction from the fourth top portion 24 toward the fourth insulating layer 64 are aligned with the second direction (in the example of FIG. 10, the X-axis direction). The direction from the first bottom portion 11 toward the fifth insulating layer 65 and the direction from the second bottom portion 12 toward the sixth insulating layer 66 are aligned with the second direction (in the example of FIG. 10, the X-axis direction).

In the magnetic memory device 122, the first thickness t65 along the first direction (the Z-axis direction) of the fifth insulating layer 65 is thicker than the second thickness t66 along the first direction of the sixth insulating layer 66.

In the magnetic memory device 122 as well, the thicknesses of at least two insulating layers (the thickness of the fifth insulating layer 65 and the thickness of the sixth insulating layer 66) are different from each other.

In the magnetic memory device 122, for example, the first diameter d1 is smaller than the second diameter d2. There are cases where the first cross-sectional area of the portion of the first magnetic portion 10 corresponding to the fifth insulating layer 65 is less than the second cross-sectional area of the portion corresponding to the sixth insulating layer 66. By setting the first thickness t65 to be thicker than the second thickness t66, for example, the errors occurring due to the difference of the bit shift speeds can be suppressed.

In the magnetic memory devices 120 to 122, the first film 60a includes, for example, silicon oxide. The second film 60b includes, for example, silicon nitride. The first film 60a may include silicon nitride; and the second film 60b may include silicon oxide. The materials of these films are selected according to the etchant used to pattern the first insulating portion 60.

The base body 50s is provided in the magnetic memory devices 120 to 122 recited above. The fifth insulating layer 65 is positioned between the sixth insulating layer 66 and the base body 50s in the first direction (the Z-axis direction). The first thickness t65 recited above is longer than the second thickness t66 recited above. For example, the thickness of the insulating layer at a portion proximal to the base body 50s is set to be thicker than the thickness of the insulating layer at a portion distal to the base body 50s. In the formation of the hole as described above, for example, there are cases where the diameter of the hole at a position proximal to the base body 50s (the bottom portion of the hole) is smaller than the diameter of the hole at a position distal to the base body 50s (the opening of the hole). For example, when forming the magnetic film on the side wall of the hole, there are cases where the thickness of the magnetic film at a position proximal to the base body 50s (the bottom portion of the hole) is thinner than the thickness of the magnetic film at a position distal to the base body 50s (the opening of the hole). In such a case, the first thickness t65 is set to be thicker than the second thickness t66. Thereby, there are cases where the cross-sectional area of the first magnetic portion 10 changes due to the change of the thickness of the magnetic film. Even in such a case, the errors occurring due to the difference of the bit shift speeds can be suppressed.

Figure 11:
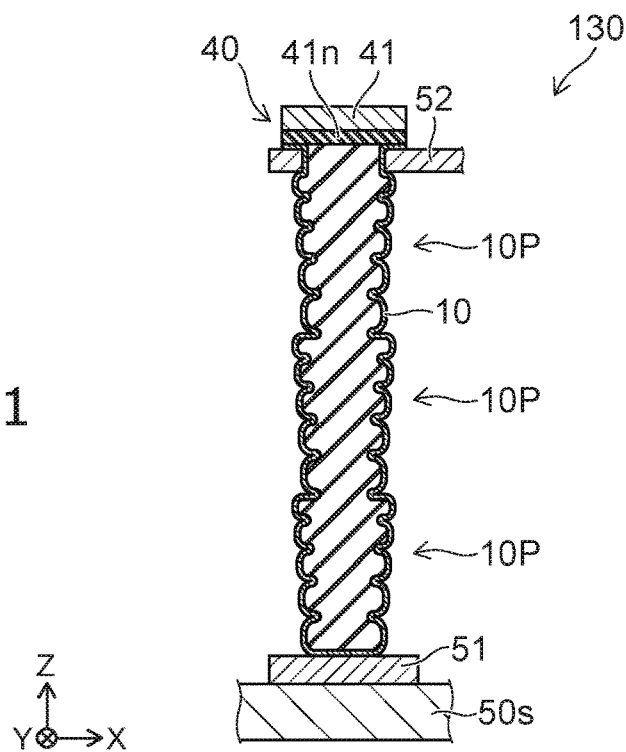
FIG. 11 is a schematic cross-sectional view illustrating another magnetic memory device according to the first embodiment.

FIG. 11 is a schematic cross-sectional view illustrating another magnetic memory device according to the first embodiment.

The controller 70 (referring to FIG. 1D) is not illustrated in FIG. 11.

In the magnetic memory device 130 as shown in FIG. 11, the first magnetic portion 10 includes the multiple structure portions 10P. The multiple structure portions 10P are arranged along the first direction (the Z-axis direction). The first to fourth bottom portions 11 to 14, the first top portion 21, and the second top portion 22 recited above (referring to FIG. 1D, etc.) are provided in each of the multiple structure portions 10P. For example, at least one of the multiple structure portions 10P includes the first to fourth bottom portions 11 to 14, the first top portion 21, and the second top portion 22.

For example, one structure portion 10P is formed by providing an insulating portion on the base body 50s, providing a hole extending in the Z-axis direction in the insulating portion, and forming a magnetic film on the side wall of the hole. The multiple structure portions 10P can be formed by multiply repeating such a process. The length of the first magnetic portion 10 can be long by using the multiple structure portions 10P.

In the magnetic memory device 130, at least one of the multiple structure portions 10P provided in the first magnetic portion 10 includes the first to fourth bottom portions 11 to 14, the first top portion 21, and the second top portion 22; and the first distance z1 is different from the second distance z2. Thereby, for example, the errors occurring due to the difference of the bit shift speeds can be suppressed. The stability of the operations can be improved.

In the embodiment recited above, the first magnetic portion 10 includes at least one selected from the group consisting of Ni, Co, and Fe. The first magnetic portion 10 may include at least one rare-earth element. For example, the first magnetic portion 10 may include at least one rare-earth element and at least one selected from the group consisting of Ni, Co, and Fe.

The first magnetic layer 41 includes, for example, at least one selected from the group consisting of Ni, Co, and Fe. The first magnetic layer 41 may include, for example, multiple magnetic films that are stacked. The first magnetic layer 41 may include multiple magnetic films that have antiferromagnetic coupling.

The first nonmagnetic layer 41n includes, for example, at least one selected from the group consisting of MgO, MgAlO, and AlO. The first nonmagnetic layer 41n may include a stacked film including multiple films including these materials. The first nonmagnetic layer 41n may further include another nonmagnetic metal.

The core insulating portion 55 includes, for example, at least one selected from the group consisting of silicon oxide (e.g., $SiO_2$) and aluminum oxide (e.g., $Al_2O_3$, etc.).

At least a portion of each of the first conductive layer 51 and the second conductive layer 52 may include at least one selected from the group consisting of W, Cu, Al, Mo, Ti, and Au.

At least one of the first conductive layer 51 or the second conductive layer 52 may include a magnetic body.

Figure 12:
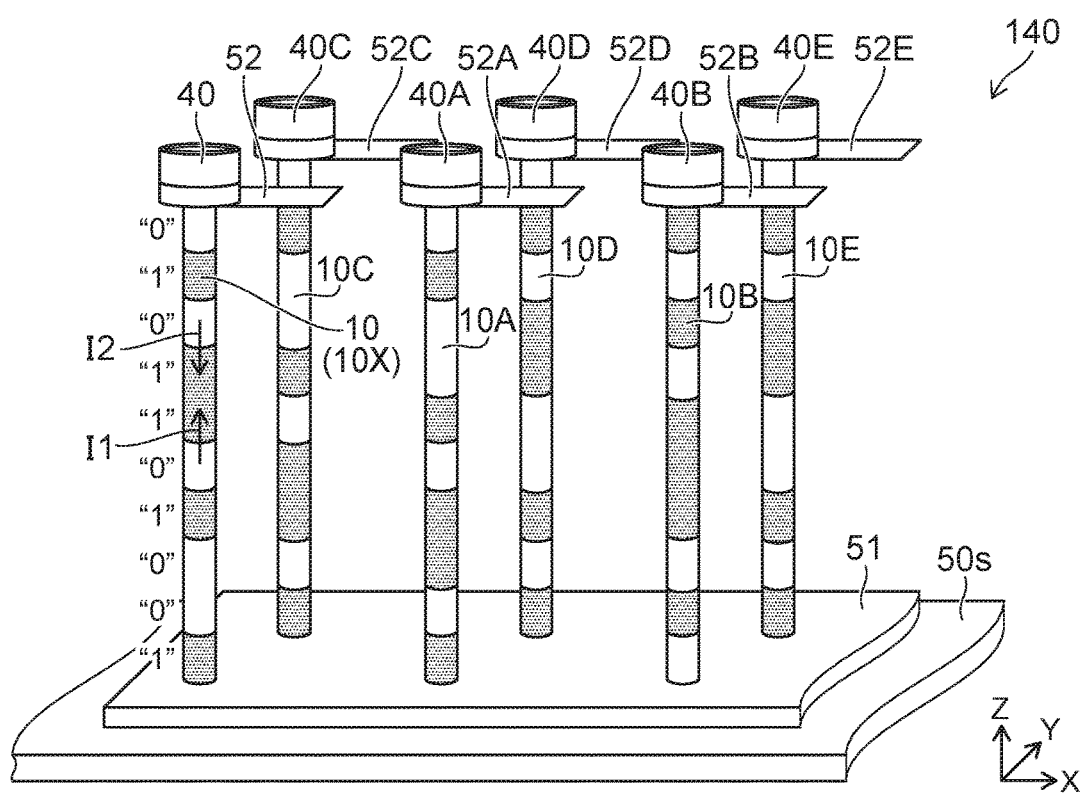
FIG. 12 is a schematic perspective view illustrating another magnetic memory device according to the first embodiment.

FIG. 12 is a schematic perspective view illustrating another magnetic memory device according to the first embodiment.

The controller 70 (referring to FIG. 1D) is not illustrated in FIG. 12.

As shown in FIG. 12, the magnetic memory device 140 includes multiple magnetic portions 10X. The first magnetic portion 10 is one of the multiple magnetic portions 10X. The multiple magnetic portions 10X include, for example, the first magnetic portion 10, magnetic portions 10A to 10E, etc. Each of the multiple magnetic portions 10X extends along the first direction (e.g., the Z-axis direction). For example, the multiple magnetic portions 10X are parallel to each other. The multiple magnetic portions 10X are arranged along the X-axis direction and the Y-axis direction. For example, the multiple magnetic portions 10X are arranged in a matrix configuration.

One first conductive layer 51 is provided in the example. The first conductive layer 51 is electrically connected to a portion (e.g., an end portion) of each of the multiple magnetic portions 10X. The second conductive layers 52 to 52E are provided respectively for the multiple magnetic portions 10X. The write/read portions 40 to 40E are provided respectively for the multiple magnetic portions 10X.

For example, a current (the first current I1 or the second current I2) is supplied to each of the multiple magnetic portions 10X (e.g., the first magnetic portion 10). The current is supplied from the controller 70 (referring to FIG. 1D). For example, the supply of the currents is controlled by providing switches between the controller 70 and the multiple second conductive layers 52 and 52A to 52E.

For example, the magnetization information ("1," "0," or the like) that is stored in the first magnetic portion 10 is shifted along the Z-axis direction according to the current.

In the magnetic memory device 140, for example, the first distance z1 and the second distance z2 (referring to FIG. 1D) are different from each other. For example, the errors occurring due to the difference of the bit shift speeds can be suppressed. The stability of the operations can be improved.

The first insulating portion 60 (referring to FIG. 8) may be provided in the magnetic memory device 140. In such a case, the first thickness t65 and the second thickness t66 may be different from each other. For example, the errors occurring due to the difference of the bit shift speeds can be suppressed. The stability of the operations can be improved.

Second Embodiment

The embodiment relates to a method for manufacturing a magnetic memory device.

FIG. 13A to FIG. 13D are schematic cross-sectional views illustrating the method for manufacturing the magnetic memory device according to the second embodiment.

Figure 13A:
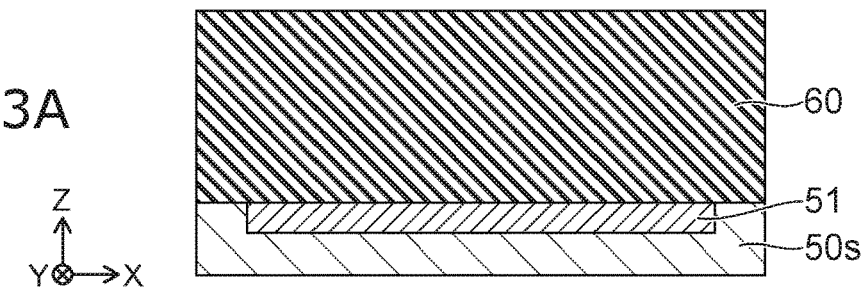
FIG. 13A to FIG. 13D are schematic cross-sectional views illustrating the method for manufacturing the magnetic memory device according to a second embodiment.

The first insulating portion 60 is prepared as shown in FIG. 13A. In the example, the first conductive layer 51 is provided on a portion of the base body 50s. The first insulating portion 60 is provided on the first conductive layer 51 and on the base body 50s. The first insulating portion 60 includes, for example, at least one selected from the group consisting of a metal oxide, a metal nitride, and a metal oxynitride. The metal includes, for example, at least one selected from the group consisting of silicon and aluminum. The first insulating portion 60 includes, for example, silicon oxide.

Figure 13B:
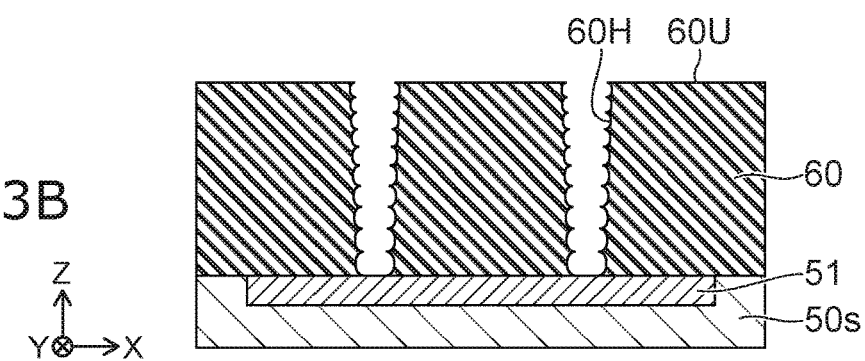

As shown in FIG. 13B, a hole 60H is formed from an upper surface 60U of the first insulating portion 60. To form the hole 60H, for example, processing that includes etching and the formation of a protective film is multiply repeated. Thereby, the hole 60H that has a high aspect ratio can be formed in the first insulating portion 60.

In the embodiment, the depth of the etching of the processing at a position proximal to the base body 50s is set to be deeper than the depth of the etching of the processing at a position distal to the base body 50s.

In other words, in the embodiment, a process of forming the hole 60H extending in the first direction (the Z-axis direction) in the first insulating portion 60 is performed. Unevennesses that are arranged along the Z-axis direction are formed in the side surface of the hole 60H.

Figure 13C:
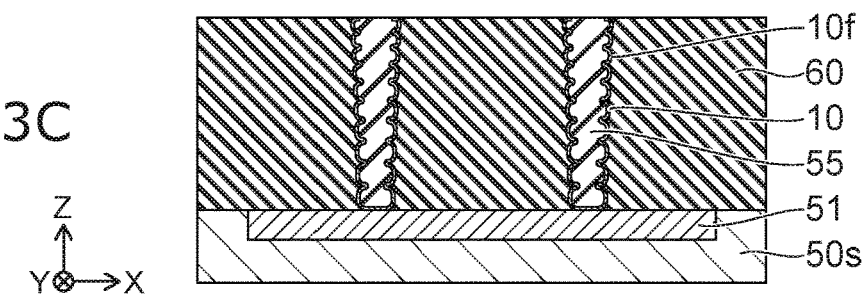

As shown in FIG. 13C, the first magnetic portion 10 is formed by forming a magnetic film 10f on the side wall of the hole 60H. In the example, the core insulating portion 55 is formed in the remaining space of the hole 60H. The formation of the core insulating portion 55 may be omitted.

Figure 13D:
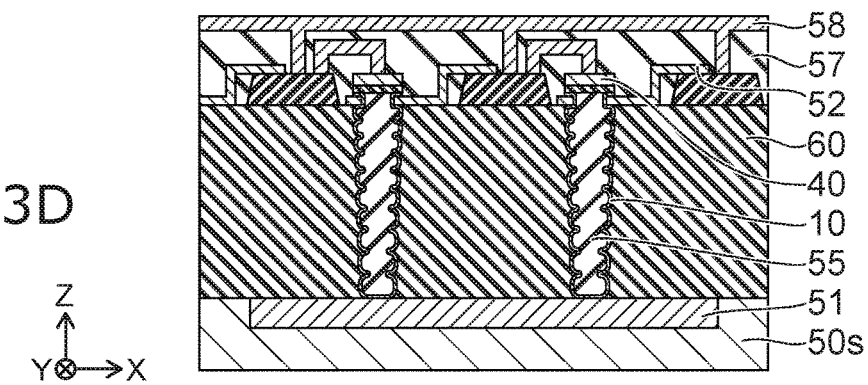

The second conductive layer 52 and the write/read portion 40 are formed as shown in FIG. 13D. An inter-layer insulating layer 57 and an interconnect 58 also are formed. Thereby, for example, the magnetic memory device 110 is manufactured.

For example, there are cases where the diameter of the hole 60H is small in a region proximal to the base body 50s and large in a region distal to the base body 50s. There are cases where the thickness of the magnetic film 10f is thin in a region proximal to the base body 50s and thick in a region distal to the base body 50s. In such a case, the widths (the lengths along the Z-axis direction) of the unevennesses of the hole 60H are modified.

An example of the modification of the widths of the unevennesses will now be described. For example, the process of forming the hole 60H includes a first processing and a second processing. The second processing is performed after the first processing. The first processing corresponds to the processing at a position distal to the base body 50s. The second processing corresponds to the processing at a position proximal to the base body 50s.

FIG. 14A to FIG. 14F are schematic cross-sectional views illustrating the method for manufacturing the magnetic memory device according to the second embodiment.

Figure 14A:
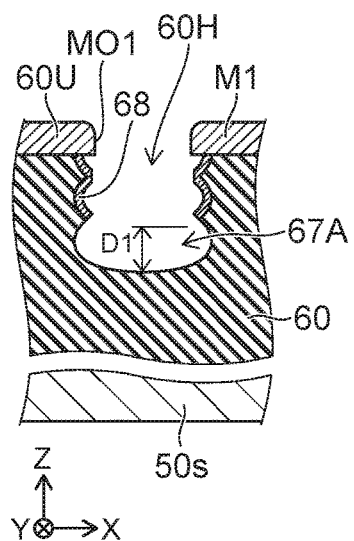
FIG. 14A to FIG. 14F are schematic cross-sectional views illustrating the method for manufacturing the magnetic memory device according to the second embodiment.
Figure 14B:
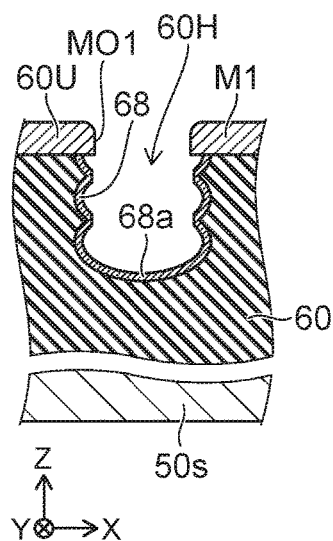
Figure 14C:
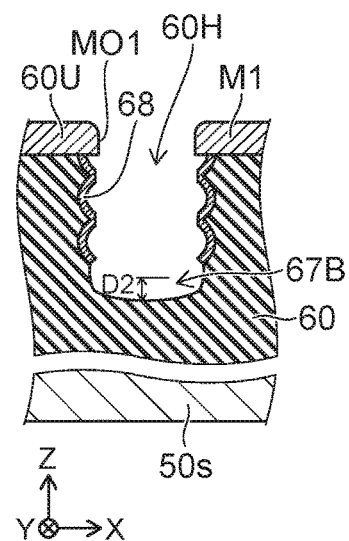
Figure 14D:
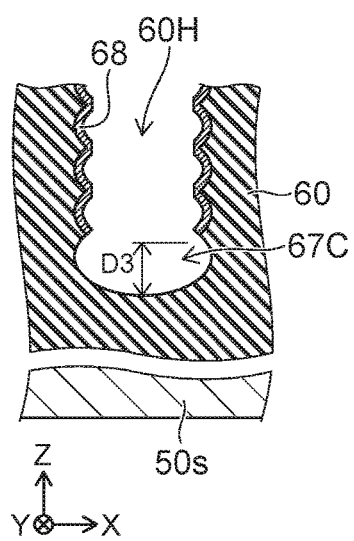
Figure 14E:
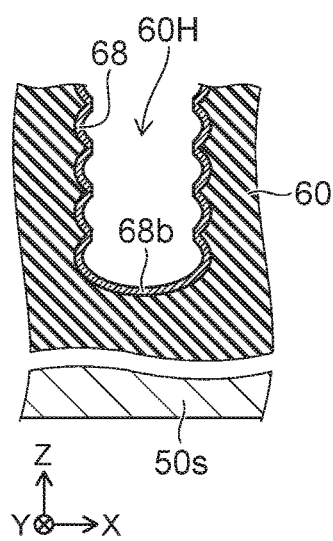
Figure 14F:
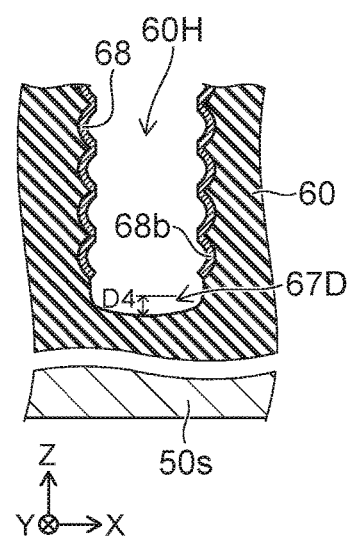

FIG. 14A to FIG. 14C illustrate the first processing. FIG. 14D to FIG. 14F illustrate the second processing.

As shown in FIG. 14A, a mask M1 is formed on the upper surface 60U of the first insulating portion 60. The mask M1 has an opening MO1. A portion of the hole 60H is formed by etching (dry etching) using the mask M1. In the case where the first insulating portion 60 includes silicon oxide, for example, etching (e.g., isotropic etching) using $SF_6$ is performed.

As shown in FIG. 14B, a protective film 68 is formed on the inner side of the hole 60H after the etching. To form the protective film 68, for example, processing using $C_4F_8$ gas is performed. The side surface of the hole 60H is protected by the protective film 68.

For example, anisotropic etching is performed as shown in FIG. 14C. The protective film 68 that is on the bottom portion of the hole 60H is removed; and the protective film 68 that is on the side surface of the hole 60H remains.

Subsequently, the processing recited above including the isotropic etching, the formation of the protective film 68, and the anisotropic etching is repeated. Thereby, the digging of the hole 60H can be continued.

Thus, the first processing includes a process of removing a first removed portion 67A of the first insulating portion 60 by a first etching (FIG. 14A). The first processing further includes a process of forming a first protective film 68a after the first etching (FIG. 14B). The first processing further includes a process of removing, by a second etching, a second removed portion 67B of the first insulating portion 60 exposed by removing a portion of the first protective film 68a (FIG. 14C).

The thickness along the first direction (the Z-axis direction) of the first removed portion 67A removed by the first etching is taken as a first removed thickness D1. The thickness along the first direction (the Z-axis direction) of the second removed portion 67B removed by the second etching is taken as a second removed thickness D2. The thickness dug by the first processing is the sum of the first removed thickness D1 and the second removed thickness D2.

As shown in FIG. 14D, etching (e.g., isotropic etching) using, for example, $SF_6$ is performed in the hole 60H of the first insulating portion 60.

As shown in FIG. 14E, the protective film 68 is formed on the inner side of the hole 60H after the etching. For example, processing using $C_4F_8$ gas is performed.

As shown in FIG. 14F, for example, anisotropic etching is performed. The protective film 68 that is on the bottom portion of the hole 60H is removed; and the protective film 68 of the side surface of the hole 60H remains.

Thus, the second processing is performed after the first processing and includes a process of removing a third removed portion 67C of the first insulating portion 60 by a third etching (FIG. 14C), a process of forming a second protective film 68b after the third etching (FIG. 14E), and a process of removing, by a fourth etching, a fourth removed portion 67D of the first insulating portion 60 exposed by removing a portion of the second protective film 68b (FIG. 14F).

The thickness along the first direction (the Z-axis direction) of the third removed portion 67C removed by the third etching is taken as a third removed thickness D3. The thickness along the first direction (the Z-axis direction) of the fourth removed portion 67D removed by the fourth etching is taken as a fourth removed thickness D4. The thickness dug by the second processing is the sum of the third removed thickness D3 and the fourth removed thickness D4.

In the embodiment, the thickness along the first direction of the third removed portion 67C and the fourth removed portion 67D (the sum of the third removed thickness D3 and the fourth removed thickness D4) is thicker than the thickness along the first direction of the first removed portion 67A and the second removed portion 67B (the sum of the first removed thickness D1 and the second removed thickness D2).

For example, the time of at least one of the third etching or the fourth etching is set to be longer than the time of at least one of the first etching or the second etching. The power of at least one of the third etching or the fourth etching is set to be greater than the power of at least one of the first etching or the second etching. Combinations of these settings may be used.

Thereby, the widths (the distances along the Z-axis direction) of the unevennesses arranged along the Z-axis direction and formed in the side surface of the hole 60H can be modified.

Figure 15A:
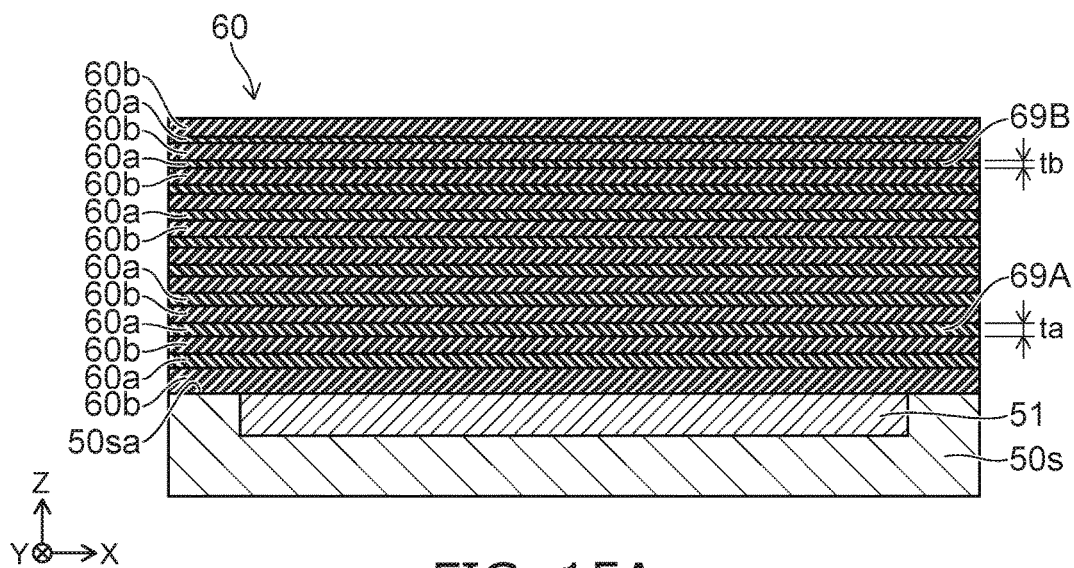
FIG. 15A and FIG. 15B are schematic cross-sectional views illustrating another method for manufacturing the magnetic memory device according to the second embodiment.
Figure 15B:
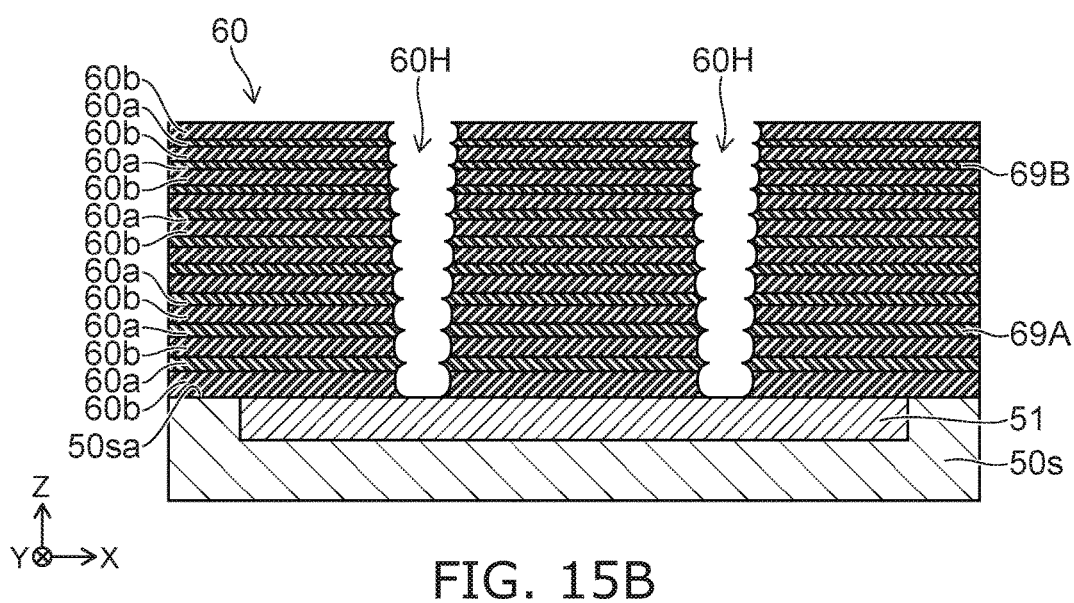

FIG. 15A and FIG. 15B are schematic cross-sectional views illustrating another method for manufacturing the magnetic memory device according to the second embodiment.

As shown in FIG. 15A, the base body 50s has a surface 50sa. The first insulating portion 60 is formed on the surface. The first insulating portion 60 includes the multiple first films 60a and the multiple second films 60b. The multiple first films 60a and the multiple second films 60b are arranged alternately in the first direction (the Z-axis direction) crossing the surface 50sa. The material of the multiple first films 60a is different from the material of the multiple second films 60b.

For example, the thickness (the length along the Z-axis direction) of the multiple first films 60a is thick at a portion proximal to the base body 50s and thick at a portion distal to the base body 50s. The thicknesses (the lengths along the Z-axis direction) of the multiple first films 60a change along the first direction (the Z-axis direction).

The multiple first films 60a include a first layer 69A and a second layer 69B. The first layer 69A is positioned between the second layer 69B and the surface 50sa.

A thickness to in the first direction of the first layer 69A is thicker than a thickness tb of the second layer 69B.

As shown in FIG. 15B, the hole 60H that extends in the first direction (the Z-axis direction) is formed in the first insulating portion 60. For example, etching is performed. A difference of the etching rates occurs because the material of the multiple first films 60a is different from the material of the multiple second films 60b. Thereby, the unevennesses are formed in the side wall of the hole 60H. Because the thicknesses (the lengths along the Z-axis direction) of the multiple first films 60a change along the first direction (the Z-axis direction), the widths (the lengths along the Z-axis direction) of the unevennesses change according to the difference of the thicknesses.

Subsequently, the first magnetic portion 10 (referring to FIG. 13C) is formed by forming the magnetic film 10f (referring to FIG. 13C) on the side wall of the hole 60H.

Thereby, for example, the magnetic memory device 120, etc., can be manufactured.

According to the method for manufacturing the magnetic memory device according to the embodiment, a magnetic memory device can be manufactured in which the stability of the operations can be improved.

The embodiments may include the following configurations (e.g., technological proposals).

Configuration 1

A magnetic memory device, comprising:
a first magnetic portion extending in a first direction;
a first magnetic layer; and
a first nonmagnetic layer provided between the first magnetic layer and a portion of the first magnetic portion,
the first magnetic portion having a first surface,
the first surface including
multiple bottom portions, and
multiple top portions,
the multiple bottom portions and the multiple top portions being arranged alternately in the first direction,
the multiple bottom portions including
a first bottom portion,
a second bottom portion adjacent to the first bottom portion in the first direction,
a third bottom portion, and
a fourth bottom portion adjacent to the third bottom portion in the first direction,
the multiple top portions including
a first top portion positioned between the first bottom portion and the second bottom portion, and
a second top portion positioned between the third bottom portion and the fourth bottom portion,
a first distance along the first direction between the first bottom portion and the second bottom portion being different from a second distance along the first direction between the third bottom portion and the fourth bottom portion.

Configuration 2

The magnetic memory device according to Configuration 1, wherein
a first cross-sectional area of the first magnetic portion cut at a first plane is less than a second cross-sectional area of the first magnetic portion cut at a second plane, the first plane passing through the first top portion and being perpendicular to the first direction, the second plane passing through the second top portion and being perpendicular to the first direction, and
the first distance is longer than the second distance.

Configuration 3

The magnetic memory device according to Configuration 2, wherein a first product of the first cross-sectional area and the first distance is not less than 0.8 times and not more than 1.2 times a second product of the second cross-sectional area and the second distance.

Configuration 4

The magnetic memory device according to Configuration 1, wherein
the first magnetic portion further includes a second surface,
a direction from the second surface toward the first surface is aligned with a second direction crossing the first direction,
the second surface has a first back surface position and a second back surface position,
a direction from the first back surface position toward the first top portion is parallel to the second direction,
a direction from the second back surface position toward the second top portion is parallel to the second direction,
a first length along the second direction between the first back surface position and the first top portion is shorter than a second length along the second direction between the second back surface position and the second top portion, and
the first distance is longer than the second distance.

Configuration 5

The magnetic memory device according to Configuration 1, wherein
a first diameter of the first magnetic portion cut at a first plane is smaller than a second diameter of the first magnetic portion cut at a second plane, the first plane passing through the first top portion and being perpendicular to the first direction, the second plane passing through the second top portion and being perpendicular to the first direction, and
the first distance is longer than the second distance.

Configuration 6

The magnetic memory device according to Configuration 5, wherein
the first diameter and the second diameter each are 100 nm or less, and
the first distance and the second distance each are 100 nm or less.

Configuration 7

The magnetic memory device according to any one of Configurations 1 to 6, wherein the first magnetic portion has a pipe configuration extending in the first direction.

Configuration 8

The magnetic memory device according to Configuration 1, further comprising a base body,
the first top portion being positioned between the second top portion and the base body in the first direction,
the first distance being longer than the second distance.

Configuration 9

The magnetic memory device according to any one of Configurations 1 to 8, wherein
the first magnetic portion includes multiple structure portions arranged along the first direction, and
at least one of the multiple structure portions includes the first to fourth bottom portions, the first top portion, and the second top portion.

Configuration 10

A magnetic memory device, comprising:
a first magnetic portion extending in a first direction; and
a first insulating portion,
a second direction from the first magnetic portion toward the first insulating portion crossing the first direction,
the first insulating portion including first to sixth insulating layers, the fifth insulating layer contacting the first insulating layer and the second insulating layer and being positioned between the first insulating layer and the second insulating layer in the first direction, a direction from the third insulating layer toward the first insulating layer being aligned with the first direction, the sixth insulating layer contacting the third insulating layer and the fourth insulating layer and being positioned between the third insulating layer and the fourth insulating layer in the first direction, a material of the fifth insulating layer and the sixth insulating layer being different from a material of the first to fourth insulating layers, a first thickness along the first direction of the fifth insulating layer being different from a second thickness along the first direction of the sixth insulating layer.

Configuration 11

The magnetic memory device according to Configuration 10, wherein the first magnetic portion has a first surface opposing the first insulating portion, the first surface includes first to fourth bottom portions, a first top portion, and a second top portion, a direction from the first bottom portion toward the first insulating layer, a direction from the second bottom portion toward the second insulating layer, a direction from the third bottom portion toward the third insulating layer, a direction from the fourth bottom portion toward the fourth insulating layer, a direction from the first top portion toward the fifth insulating layer, and a direction from the second top portion toward the sixth insulating layer are aligned with the second direction, and the first thickness is thicker than the second thickness.

Configuration 12

The magnetic memory device according to Configuration 10, wherein the first magnetic portion has a first surface opposing the first insulating portion, the first surface includes first to fourth top portions, a first bottom portion, and a second bottom portion, a direction from the first top portion toward the first insulating layer, a direction from the second top portion toward the second insulating layer, a direction from the third top portion toward the third insulating layer, a direction from the fourth top portion toward the fourth insulating layer, a direction from the first bottom portion toward the fifth insulating layer, and a direction from the second bottom portion toward the sixth insulating layer are aligned with the second direction, and the first thickness is thicker than the second thickness.

Configuration 13

The magnetic memory device according to any one of Configurations 10 to 12, further comprising a base body, the fifth insulating layer being positioned between the sixth insulating layer and the base body in the first direction, the first thickness being thicker than the second thickness.

Configuration 14

The magnetic memory device according to any one of Configurations 10 to 13, further comprising:

a first magnetic layer; and a first nonmagnetic layer provided between the first magnetic layer and a portion of the first magnetic portion.

Configuration 15

The magnetic memory device according to any one of Configurations 1 to 14, further comprising a controller, the first magnetic portion including a first portion and a second portion, a direction from the first portion toward the second portion being aligned with the first direction, the controller supplying a first current to the first magnetic portion from the first portion toward the second portion, magnetization information moving along the first direction according to the first current, the magnetization information being included in the first magnetic portion.

Configuration 16

The magnetic memory device according to any one of Configurations 1 to 15, wherein the first magnetic portion includes at least one selected from the group consisting of Ni, Co, and Fe.

Configuration 17

The magnetic memory device according to any one of Configurations 1 to 16, wherein the first magnetic portion includes at least one rare-earth element.

Configuration 18

The magnetic memory device according to any one of Configurations 1 to 17, wherein a magnetization of at least a portion of the first magnetic portion crosses the first direction.

Configuration 19

A method for manufacturing a magnetic memory device, comprising:

forming a hole in a first insulating portion by performing a first processing and by performing a second processing after the first processing, the hole extending in a first direction; and forming a first magnetic portion by forming a magnetic film on a side wall of the hole, the first processing including removing a first removed portion of the first insulating portion by a first etching, forming a first protective film after the first etching, and removing a second removed portion of the first insulating portion by a second etching, the second removed portion being exposed by removing a portion of the first protective film, the second processing including removing a third removed portion of the first insulating portion after the first processing by a third etching, forming a second protective film after the third etching, and removing a fourth removed portion of the first insulating portion by a fourth etching, the fourth removed portion being exposed by removing a portion of the second protective film, thicknesses along the first direction of the third removed portion and the fourth removed portion being thicker than thicknesses along the first direction of the first removed portion and the second removed portion.

Configuration 20

A method for manufacturing a magnetic memory device, comprising:

forming a first insulating portion on a surface of a base body, the first insulating portion including multiple first films and multiple second films, the multiple first films and the multiple second films being arranged alternately in a first direction crossing the surface, a material of the multiple first films being different from a material of the multiple second films, the multiple first films including a first layer and a second layer, the first layer being positioned between the second layer and the surface, a thickness in the first direction of the first layer being thicker than a thickness in the first direction of the second layer;

forming a hole in the first insulating portion, the hole extending in the first direction; and forming a first magnetic portion by forming a magnetic film on a side wall of the hole.

According to the embodiments, a magnetic memory device and a method for manufacturing the magnetic memory device can be provided in which the stability of the operations can be improved.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

In the specification, a state of being electrically connected includes a state in which a first conductor and a second conductor contact each other. The state of being electrically connected includes a state in which a third conductor is provided in a current path between the first conductor and the second conductor, and current flows in the current path. The state of being electrically connected includes a state in which a control element such as a switch is provided in the current path between the first conductor and the second conductor and a state in which current flows in the current path is possible to be formed by the operation of the control element.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in magnetic memory devices such as magnetic portions, magnetic layers, nonmagnetic layers, conductive layers, insulating portions, controllers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all magnetic memory devices, and methods for manufacturing the same practicable by an appropriate design modification by one skilled in the art based on the magnetic memory devices, and the methods for manufacturing the same described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic memory device, comprising:
a first magnetic portion extending in a first direction;
a first magnetic layer;
a first nonmagnetic layer provided between the first magnetic layer and a portion of the first magnetic portion; and
a core insulating portion extending along the first direction,
the first magnetic portion being provided around the core insulating portion,
the first magnetic portion having a first surface,
the first surface including
a plurality of bottom portions, and
a plurality of top portions,
the bottom portions and the top portions being arranged alternately in the first direction,
the bottom portions including
a first bottom portion,
a second bottom portion adjacent to the first bottom portion in the first direction,
a third bottom portion, and
a fourth bottom portion adjacent to the third bottom portion in the first direction,
the top portions including
a first top portion provided between the first bottom portion and the second bottom portion, and
a second top portion provided between the third bottom portion and the fourth bottom portion,
a first distance along the first direction between the first bottom portion and the second bottom portion being different from a second distance along the first direction between the third bottom portion and the fourth bottom portion,
wherein
the first magnetic portion further includes a second surface,
a direction from the second surface toward the first surface is aligned with a second direction crossing the first direction,
the second surface has a first back surface position and a second back surface position,
a direction from the first back surface position toward the first top portion is parallel to the second direction,
a direction from the second back surface position toward the second top portion is parallel to the second direction,
a first length along the second direction between the first back surface position and the first top portion is shorter than a second length along the second direction between the second back surface position and the second top portion,
a first diameter of the first magnetic portion cut at a first plane is smaller than a second diameter of the first magnetic portion cut at a second plane, the first plane passing through the first top portion and being perpendicular to the first direction, the second plane passing through the second top portion and being perpendicular to the first direction, and
the first distance is longer than the second distance.

2. The device according to claim 1, wherein
a first cross-sectional area of the first magnetic portion cut at the first plane is less than a second cross-sectional area of the first magnetic portion cut at the second plane.

3. The device according to claim 2, wherein a first product of the first cross-sectional area and the first distance is not less than 0.8 times and not more than 1.2 times a second product of the second cross-sectional area and the second distance.

4. The device according to claim 1, wherein
the first diameter and the second diameter each are 100 nm or less, and
the first distance and the second distance each are 100 nm or less.

5. The device according to claim 1, wherein the first magnetic portion has a pipe configuration extending in the first direction.

6. The device according to claim 1, further comprising a base body,
the first top portion being provided between the second top portion and the base body in the first direction.

7. The device according to claim 1, wherein
the first magnetic portion includes a plurality of structure portions arranged along the first direction, and
at least one of the structure portions includes the first to fourth bottom portions, the first top portion, and the second top portion.

8. The device according to claim 1, further comprising a controller,
the first magnetic portion including a first portion and a second portion,
a direction from the first portion toward the second portion being aligned with the first direction,
the controller supplying a first current to the first magnetic portion from the first portion toward the second portion,
magnetization information moving along the first direction according to the first current, the magnetization information being included in the first magnetic portion.

9. The device according to claim 1, wherein the first magnetic portion includes at least one selected from the group consisting of Ni, Co, and Fe.

10. The device according to claim 1, wherein the first magnetic portion includes at least one rare-earth element.

11. The device according to claim 1, wherein a magnetization of at least a portion of the first magnetic portion crosses the first direction.

* * * * *